United States Patent [19]

Bhattacharyya et al.

[11] Patent Number: 5,608,261

[45] Date of Patent: Mar. 4, 1997

[54] HIGH PERFORMANCE AND HIGH CAPACITANCE PACKAGE WITH IMPROVED THERMAL DISSIPATION

[75] Inventors: Bidyut K. Bhattacharyya, Phoenix, Ariz.; Shigeo Tanahashi, Kagoshima, Japan

[73] Assignee: Intel Corporation, Santa Clara, Calif.

[21] Appl. No.: 367,442

[22] Filed: Dec. 28, 1994

[51] Int. Cl.$^6$ ................................................. H01L 23/12
[52] U.S. Cl. ........................... 257/700; 257/723; 257/724
[58] Field of Search .................................. 257/924, 724, 257/700, 723, 710

[56] References Cited

U.S. PATENT DOCUMENTS 5,210,683  5/1993  Ley .............................................. 361/414

FOREIGN PATENT DOCUMENTS 2616963  12/1988  France ........................................ 257/924
63-96931   4/1988  Japan ......................................... 257/924
63-187650  8/1988  Japan ......................................... 257/924

Primary Examiner—Sara W. Crane
Assistant Examiner—Roy Potter
Attorney, Agent, or Firm—Blakely, Sokoloff, Taylor & Zafman

[57] ABSTRACT

A thermally dissipative IC package which can accommodate large discrete capacitors. The package substrate incorporates a recessed region on one of its surfaces which is separate from the region in which the IC device is placed. Inside this recessed region is placed a discrete capacitor such that the entire capacitor resides below the surface of the substrate within the recessed region. Finally, a metal plate is attached to the surface of the substrate, unencumbered by the discrete capacitor.

9 Claims, 3 Drawing Sheets

5,608,261

HIGH PERFORMANCE AND HIGH CAPACITANCE PACKAGE WITH IMPROVED THERMAL DISSIPATION

FIELD OF THE INVENTION

The present invention relates to integrated circuit package technology and more particularly to an integrated circuit package incorporating discrete capacitors.

BACKGROUND OF INVENTION

Integrated Circuits (IC's) are the computer chips which run today's highly sophisticated electronic devices. Once an IC has been fabricated, it is placed inside an IC package, and the circuitry within the IC is electrically coupled to interconnects running through the package to leads on the external surface of the package. The IC is then permanently sealed within the package and is operated through the package walls from these external leads. It is the IC package which is responsible for not only protecting the IC from damage but also providing the IC with an environment in which the IC can operate at peak performance. However, current package technologies may not be suitable for supporting some of the more highly advanced IC's. Therefore, to exploit the full potential of these IC's, including next generation microprocessors and controllers, more highly advanced package design techniques must be employed.

There are many design constraints and operational parameters which must be accounted for when designing an IC package. For example, some IC's, particularly microprocessors and other devices which consume a large amount of power, generate a significant amount of heat while operating. If not adequately dissipated, this heat can degrade the performance of the IC by, for instance, slowing the operational speed of the device. In addition, if the heat generated by an IC is not readily removed, the IC can effectively destroy itself by causing its own circuitry to melt or become otherwise detrimentally altered. For example, junction spiking is a common mechanism by which the interconnects of an IC are shorted to the IC substrate in the presence of thermal activation, thereby destroying the device.

A popular method for dissipating the heat generated by an IC within a package is to thermally couple the bottom of the IC to the top of a large metal plate. This is typically done using a thermally conductive solder paste to attach the IC to the center of the metal plate. The bottom of the plate then forms a portion of an exterior wall of the package while the top of the plate is attached to the rim of the package, sealing the IC inside the package. When the IC is operated in this configuration, heat generated by the IC is conducted through the metal plate to the external surface of the package. This heat is then dissipated to the ambient environment.

Another consideration an IC package designer must account for is the amount of noise a particular IC can tolerate on the power and ground supply lines. Noise on a supply line can have the effect of varying the voltage on the line by a certain amount. If this amount is greater than a particular threshold value, the IC may interpret the varying voltage as an actual input signal and react accordingly, changing the state of its internal circuitry. This can cause IC data errors, or, in more severe situations, supply line noise can induce a phenomenon known as latchup, which destroys the IC altogether. As supply voltages continue to decrease and IC frequencies continue to increase, supply line noise problems become even more pernicious since, for example, the variation in voltage supply levels caused by the noise accounts for an increasingly greater proportion of the total supply voltage.

Unfortunately, methods for suppressing supply line noise are not compatible with the above described method of dissipating the heat generated by an IC. This is because IC supply line noise is suppressed by routing the power and ground lines to external leads on the surface of the package and attaching large, discrete capacitors to these leads. These large capacitors serve to filter high frequency noise from the supply lines, isolating the steady, direct current (dc) component of the supply for use by the IC. But the large metal plate used for heat dissipation occupies the area where these discrete capacitors would otherwise be placed. As a result, packages which incorporate a metal plate for heat dissipation must rely on the relatively small amount of capacitance which can be contained within the package for high frequency noise suppression. This amount of capacitance is generally too small to adequately filter much of the noise from the supply lines.

What is desired is an IC package which can provide the benefits associated with large capacitance noise filtering while remaining compatible with thermal dissipation techniques.

SUMMARY OF THE INVENTION

A thermally dissipative IC package is described which can accommodate large discrete capacitors. The package substrate incorporates a recessed region on one of its surfaces which is separate from the region in which the IC device is placed. Inside this recessed region is placed a discrete capacitor of a size such that the entire capacitor resides below the surface of the substrate within the recessed region. Finally, a metal plate is attached to the surface of the substrate, unencumbered by the discrete capacitor.

DETAILED DESCRIPTION

A low noise, high thermal dissipation integrated circuit (IC) package is described. In the following description, numerous specific details such as material compositions, electrical component values, package designs, etc., are set forth in order to provide a more thorough understanding of the present invention. However, it will be apparent to one skilled in the art that the present invention may be practiced without employing these specific details. In other instances, well known processes, techniques, and structures have not been described in detail in order to avoid unnecessarily obscuring the present invention.

Figure 1:
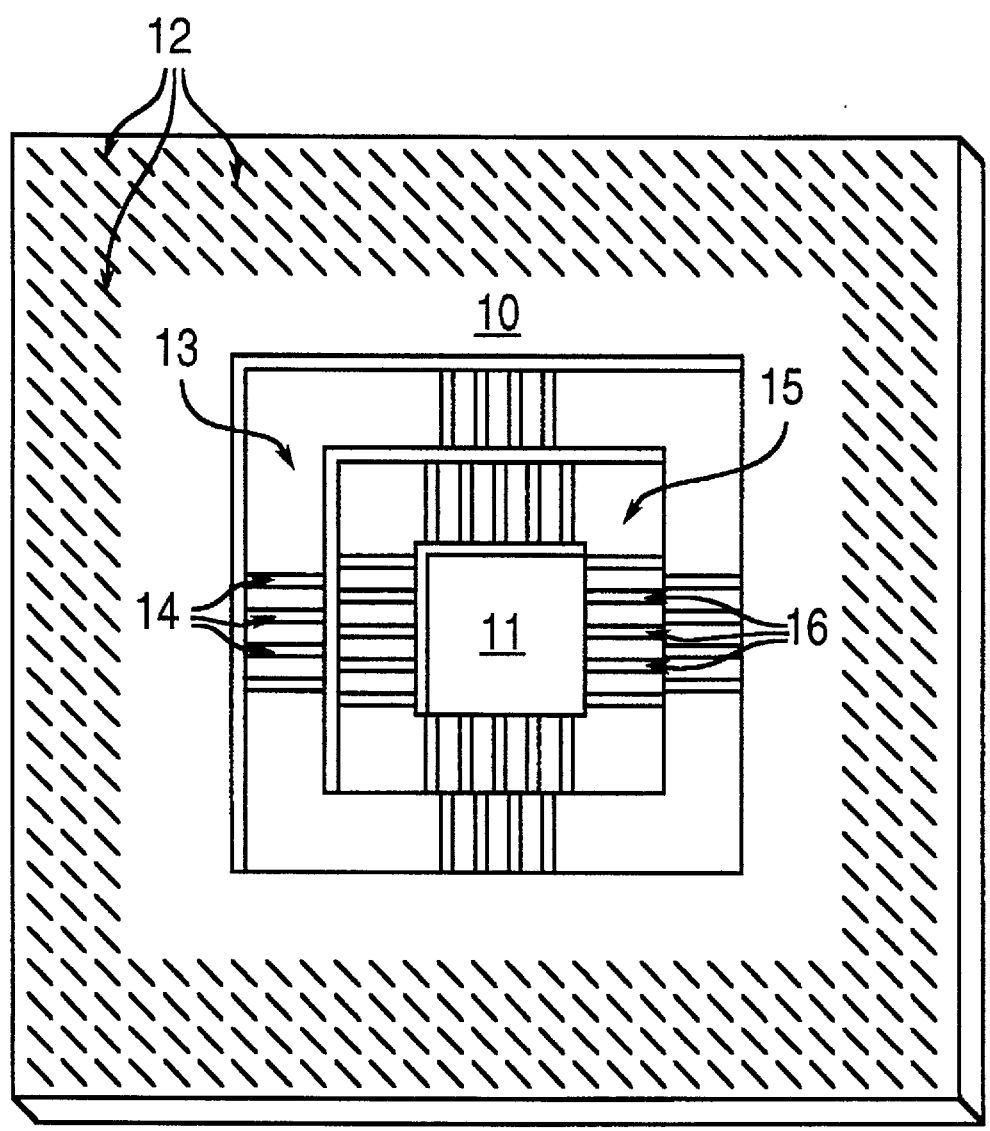
FIG. 1 is an illustration of the top of a package substrate formed in accordance with the present invention.
Figure 2:
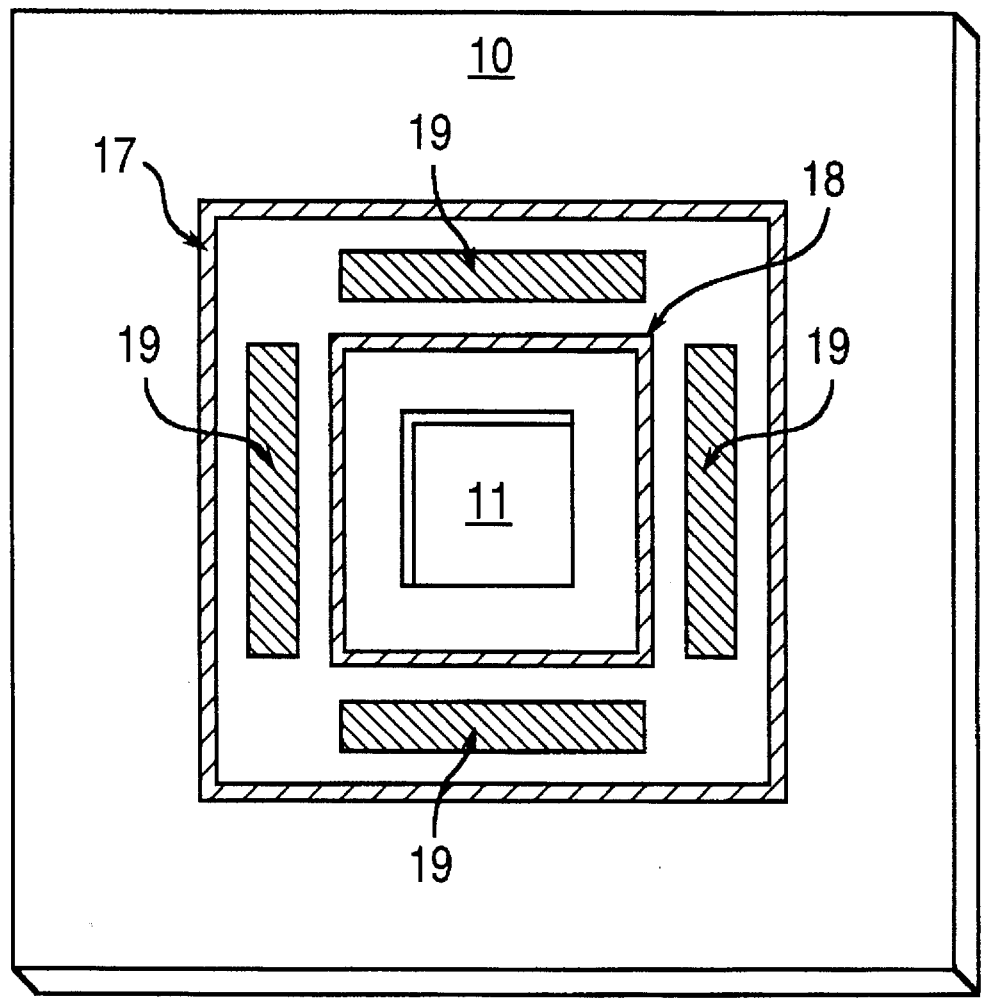
FIG. 2 is an illustration of the bottom of the package substrate illustrated in FIG. 1.
Figure 3:
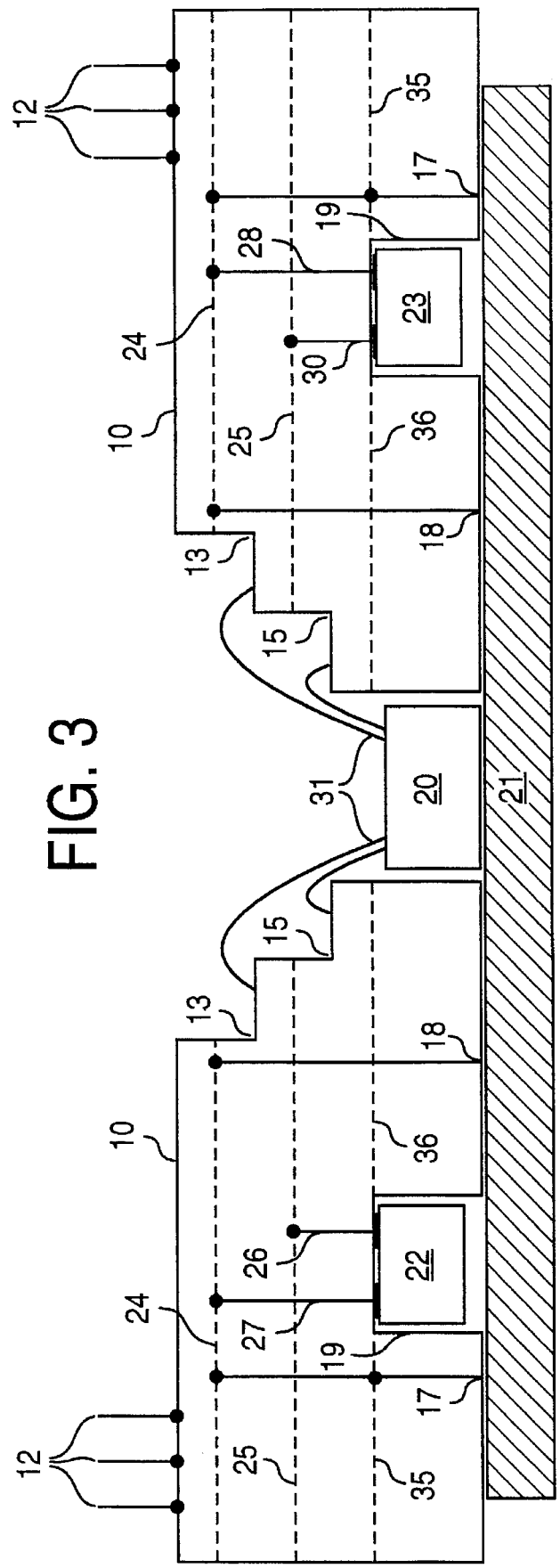
FIG. 3 is an illustration of a cross-sectional view of the package substrate illustrated in FIG. 2 including additional components.

While diagrams representing the present invention are illustrated in FIGS. 1–3, these illustrations are not intended to limit the invention. The specific structure described herein is only meant to help clarify an understanding of the present invention and to illustrate a particular embodiment in which the present invention may be implemented in order to form an IC package.

FIG. 1 illustrates a view of the top of a substrate 10 from which a package is formed in accordance with the present invention. Package substrate 10 is designed to form a pin grid array (PGA) package for an IC. Along the periphery of substrate 10 are electrically conductive pins 12 which are used to electrically couple an IC contained within the package to an external, electronic system through an associated PGA socket. After an IC is properly secured within the package, each pin 12 is internally routed through the package to a bond pad on the IC, allowing the IC to communicate with the external, electronic system through external pins 12.

Alternatively, any number of pins are formed along the periphery of the substrate, and not all of the pins may be coupled to the IC. In another embodiment, another type of substrate is used to form another type of package such as one in which pins protrude out from the edge of the package substrate. Alternatively, a package is used in which pads or solder balls are formed along the entire surface of one side of the package substrate such as, for example, a ball grid array (BGA) package. Thus, the present invention may be employed in conjunction with virtually any type of IC packaging method.

Substrate 10 of FIG. 1 comprises a ceramic shell with metal interconnect lines formed inside. These metal interconnect lines carry electrical signals between an IC packaged within substrate 10 and external pins 12. In addition, metal layers, called power planes and ground planes (described in greater detail below), separated by a dielectric material, are formed within package substrate 10. Alternatively, the package substrate primarily comprises another type of electrically insulative material, such as a plastic, polyimide, or any other material capable of electrically isolating the interconnect lines formed within the substrate.

Nearer the center of package substrate 10, surrounding through hole 11, are bonding shelves 13 and 15. On the surface of first bonding shelf 15 are exposed portions of metal interconnect lines 16 formed in a first interconnect layer of package substrate 10. On the surface of second bonding shelf 13 are exposed portions of metal interconnect lines 14 formed in a second interconnect layer of package substrate 10. It is these exposed portions of the metal interconnect layers to which the bond pads of an IC encapsulated within the package are wire bonded after the IC is placed within through hole opening 11. Alternatively, any number of bonding shelves associated with an equal number of metal interconnect layers may be formed within the package substrate.

FIG. 2 illustrates a view of the bottom of substrate 10. In accordance with the present invention, recessed regions 19 are formed in substrate 10. The dimensions of recessed region 19 are such that a discrete capacitor can be placed entirely within recessed region 19 without protruding above the surface of substrate 10. Therefore, the depth of region 19 is greater than or equal to the depth (or thickness) of a capacitor placed within recessed region 19. The depth of recessed region 19 should be less than the depth to the interconnect layer on the first shelf 15 of package substrate 10 illustrated in FIG. 1 so as not to disturb this interconnect layer. The recessed region is created by punching holes through the individual ceramic piece or pieces used to form the bottom layer of the multilayer package substrate while still in green tape, before firing. Therefore, the depth of the recessed region is equal to the thickness of the ceramic piece or pieces through which the hole is formed.

Square seal rings 17 and 18 of FIG. 2 are metal rings formed on the bottom of ceramic substrate 10. These metallic rings are connected to the ground plane of the package. This helps the IC to pump the ground current through the IC substrate. These rings also aid in sealing the subsequently affixed metal plate (described below) to the bottom of the package. Outer square ring 17 is the surface to which a complementary outer square ring on the metal plate is attached while inner square ring 18 is attached to a complementary inner square ring on the metal plate. In one embodiment, seal rings 17 and 18 comprise nickel plated tungsten while the complementary rings on the metal plate similarly comprise a nickel plated surface. Note that the outer ring 17, when connected to the metal plate, not only serves to hermetically seal recessed regions 19 but also through hole 11, where the IC is placed, on the bottom of package substrate 10. In addition, inner ring 18, when connected to the metal plate, further provides for hermetic sealing of through hole 11, isolating recessed regions 19 from the through hole where the IC is placed. Inner ring 18 also provides better grounding for the IC substrate since it is located closer to the IC than outer ring 17.

Alternatively, only a single outer ring, with no inner ring, may be formed to hermetically seal both the recessed regions where capacitors are located along with the through hole where the IC is located. Note that alternate metallic or other compounds may be employed in place of or in addition to the nickel plated tungsten film used to form the seal rings. For example, in one embodiment the nickel plated tungsten seal ring is coated with gold.

FIG. 3 illustrates a cross section of the package substrate illustrated in FIGS. 1 and 2 after IC 20, metal plate 21, and capacitors 22 and 23 have been affixed to package substrate 10. In accordance with the present invention, a capacitor is placed within each of the four recessed regions 19 illustrated in FIG. 2. As described above, the capacitors entirely fit within the recessed regions and lie below the bottom surface of substrate 10. In this manner, the subsequently attached metal plate 21 is allowed to lie flush with the bottom surface of the substrate, unencumbered by the capacitors. Alternatively, two or more capacitors may be placed within a single recessed region, and any number of recessed regions may be formed.

Suppressing the noise on IC supply lines involves the addition of capacitance between the power and ground supplies. To add this capacitance, an interwoven series of power planes and ground planes are formed within package substrate 10. Power planes 25 and 36 are layers of conductive material to which a power line carrying the IC's power supply voltage is electrically coupled. Ground planes 24 and 35 are layers of conductive material to which a ground line carrying the IC's ground supply is coupled. The power planes are separated from the ground planes by a layer of electrically insulative, dielectric material. Thus, the power planes and ground planes act as the two terminals of capacitors, shunting high frequency noise on the supply line while isolating the steady, direct current (dc) component of the supply for use by the IC.

Unfortunately, this method of providing power and ground planes is only capable of adding a small amount of capacitance between the power and ground supply lines. Since capacitance is inversely proportional to the cutoff frequency of a capacitor's filtering capabilities, the small amount of capacitance formed by the power and ground planes filters out high frequency noise. The addition of discrete capacitors to an IC package increases the capacitance between power and ground planes to also filter lower frequency noise components.

In accordance with the present invention, discrete capacitors are added to package substrate 10 within recessed regions 19 so as not to interfere with the subsequent incorporation of a thermally dissipating metal plate to the bottom surface of the package substrate. As illustrated in FIG. 3, capacitors 22 and 23 do not protrude outside recessed region 19 of package substrate 10. The capacitors remain embedded into recessed regions 19 to provide additional capacitance between the power and ground supplies to the package while remaining compatible with the below described thermal dissipation technique. The additional capacitance contributed by the discrete capacitors allows additional, lower frequency noise to be filtered from the supply lines to the package, thereby improving the reliability of operation of the IC contained within the package. Alternatively, one or more of the discrete capacitors my be used to benefit other operational aspects of the IC.

The two terminal ends of each of capacitors 22 and 23 are coupled to each of two respective nickel plated tungsten pads at the base of recessed regions 19, which are in turn coupled to conductive planes within package substrate 10 as illustrated. The positive terminal end of capacitor 22 is coupled to power plane 36 and to power plane 25 through via 26 while the negative terminal end of capacitor 22 is coupled to ground plane 35 and to ground plane 24 through via 27. Similarly, the positive terminal end of capacitor 23 is coupled to power plane 36 and to power plane 25 through via 30 while the negative terminal end of capacitor 23 is coupled to ground plane 35 and to ground plane 24 through via 28. Alternatively, the terminals of the capacitors may be coupled to any other power or ground supply contacts, or, where additional power and ground planes are formed within the package, the capacitors may be coupled to a multiple number of power or ground planes.

Note that compared to conventional methods of forming discrete capacitors on IC packages, the lengths of vias 26, 27, 28, and 30 are significantly shortened. In conventional methods, discrete capacitors are formed on the bottom surface of a package substrate rather than within recessed regions. As a result, coupling the internal power and ground planes of this conventional type of package to the discrete capacitors at its surface requires longer vias. Since in accordance with the present invention discrete capacitors are embedded into recessed regions within the package, discrete capacitors are effectively brought closer to the power and ground planes. Therefore, shorter vias are required to couple these recessed capacitors to the power and ground planes within the package.

Longer vias formed in an IC package contribute a more significant amount of inductance to an electrical signal carried by the via than shorter vias. As described above, vias 26, 27, 28, and 30 coupling the discrete capacitors 22 and 23 to the power and ground planes within package substrate 10 are shorter than they would be in a conventional method. In a conventional method, capacitors are located on the external surface of the package substrate or otherwise extended away from the power and ground planes to enable, for example, flux to be cleaned from underneath the capacitors. Therefore, in accordance with the present invention the inductance on the power supply to IC 20 contained within package substrate 10 is significantly reduced, increasing the efficiency with which power is delivered to IC 20 and further reducing the noise on the supply lines. Moreover, note that in the embodiment of the present invention illustrated in FIG. 3, the terminal ends of the discrete capacitors formed within recessed regions 19 reside in the same plane as power and ground planes 36 and 35, respectively. In this configuration, the capacitor vias which contribute to inductance on the supply lines are eliminated.

After capacitors 22 and 23 are placed within recessed regions 19; metal plate 21 is placed on the bottom of the substrate as illustrated, and the capacitors and metal plate are fused to the package substrate in a single thermal step. Metal plate 21 is a pure copper substrate with a nickel plated surface. Plate 21 is sealed to outer seal ring 17 and inner seal ring 18 using a paste comprising AgBiSnPd which is screen printed to the region of plate 21 which comes into contact with the outer and inner seal rings on the package substrate. As discussed above, the capacitors reside entirely within recessed regions 19 so as not to impede the attachment of plate 21 to the bottom of package substrate 10. Plate 21 forms a hermetic seal along seal rings 17 and 18. Consequently, capacitors 22 and 23 are hermetically sealed within recessed regions 19 of the package substrate between the inner and outer seal rings.

In addition, plate 21 hermetically seals IC 20 within package substrate 10, at least from the bottom of the package (another plate, described below, is used to hermetically seal the IC into the package from the top of the package). Furthermore, since two distinct inner and outer seal rings are used, even if one of the seal rings fails, the other continues to provide a hermetic seal for the IC. In an alternate embodiment, the metal plate or capacitors may be attached to the package substrate using any one of a number of other pastes including GeAu, Ag—In_Sn—Pb, Ag—Cu—In_ Sn, or Pb—Sn. Note, however, that in an embodiment of the present invention in which a Pb—Sn paste is used, it may be necessary to gold plate the conductive surfaces being coupled.

After capacitors 22, 23, and metal plate 21 are attached to the package substrate, IC device 20 is affixed to the metal plate from the top opening of the package substrate. IC device 20 is affixed by a eutectic method ensuring adequate thermal and electrical coupling between the IC device and the metal plate. Alternatively, the IC device is affixed using an electrically and thermally conductive epoxy. Note that since the IC is attached after the capacitors are attached, a cleaner, more robust, high temperature method can be used to attach capacitors 22 and 23 to package substrate 10. For example, the capacitors may be attached by brazing rather than solder methods which require subsequent cleaning. Thus, in accordance with the present invention, the method used to attach the metal plate and capacitors uses materials which have a higher melting point than the temperatures used to attach the IC to the metal plate.

After IC 20 is secured to metal plate 21, each of the bond pads on the IC are wire bonded to the exposed portions of interconnect lines 14 and 16, illustrated in FIG. 1, on shelves 13 and 15 respectively. In this manner, bond wires 31 complete the electrical path coupling external pins 12 to the interconnect lines formed within package substrate 14o These interconnect lines are coupled to the internal circuitry of IC 20 through bond wires 31. After wire bonding, a final plate is attached to the top of package substrate 10 to hermetically seal the IC within the package.

As IC 20 operates, the heat generated by the IC is absorbed by metal plate 21 and conducted to the bottom surface of the plate, which is exposed to the ambient atmosphere outside the package. Consequently, metal plate 21 may be cooled by any one of a number of heat dissipation methods such as, for example, air or liquid cooling. In this manner, IC 20 is kept relatively cool inside the package, enabling the IC to operate at peak performance. The purpose of metal plate 21 is to absorb heat from IC 20 and dissipate that heat outside the package. Therefore, in an alternate embodiment of the present invention, the plate comprises any thermally conductive material such as Cu—W or other metals, preferably having a coefficient of expansion similar to the coefficient of expansion of the IC. By approximately matching these coefficients of expansion, the IC is less likely to crack or become detached from the plate.

In addition, in an alternate embodiment of the present invention, the IC need not be directly attached to the plate. Instead, the IC is coupled to another substrate which is thermally coupled to the plate through thermally conductive vias or a thermal paste such as a solder. Also, in an alternate embodiment, the plate need not be thermally conductive. Instead, the plate comprises a dielectric material, such as a ceramic or plastic, and merely serves as a protective plate for hermetically sealing the capacitors and IC within the package substrate. This embodiment may be found useful in applications where thermal dissipation is not as much a concern as is noise suppression on the IC supply lines.

Thus, an IC package which can provide the benefits associated with large discrete capacitance while remaining compatible with thermal dissipation techniques has been described.

What is claimed is:

1. A package configured to house an integrated circuit comprising:

a substrate having a surface;

at least one recessed region within said surface of said substrate;

at least one discrete capacitor disposed below said surface of said substrate within said recessed region;

at least one through hole within said substrate, said through hole provided to house said integrated circuit; and at least one metal plate attached to said surface of said substrate, said metal plate configured to hermetically seal said capacitor within said recessed region and to hermetically seal one side of said through hole.

2. The package of claim 1 further comprising a ground plane of said package electrically coupled to both a first terminal end of said capacitor and to said metal plate, and a power plane of said package electrically coupled to a second terminal end of said capacitor.

3. The package of claim 1 wherein said metal plate comprises copper.

4. The package of claim 3 wherein said integrated circuit is thermally coupled to said metal plate.

5. The package of claim 1 wherein said package is a pin grid array package.

6. The package of claim 1 wherein said package is a ball grid array package.

7. A ceramic package configured to house an integrated circuit, said ceramic package further comprising:

a ground plane electrically coupled to a ground line;

a power plane electrically coupled to a power line;

at least one recessed region within a surface of said package;

at least one discrete capacitor disposed below said surface of said package within said recessed region and having a first terminal end electrically coupled to said ground plane and a second terminal end electrically coupled to the power plane; and at least one metal plate attached to said surface of said package, said plate configured to hermetically seal the capacitor within said recessed region.

8. The package of claim 7 further comprising an integrated circuit (IC) attached to said plate such that said plate hermetically seals said IC within said package and said plate conducts heat generated by said IC away from said IC.

9. The package of claim 7 wherein a plurality of capacitors are disposed within a plurality of recessed regions in a substantially similar manner as said capacitor.

* * * * *

UNITED STATES PATENT AND TRADEMARK OFFICE
CERTIFICATE OF CORRECTION

PATENT NO. : 5,608,261

DATED : March 4, 1997

INVENTOR(S) : Bhattacharyya et al.

It is certified that error appears in the above-identified patent and that said Letters Patent is hereby corrected as shown below:

In column 6 at line 52 delete "14o" and insert --14.--

Signed and Sealed this

First Day of July, 1997

Attest:

BRUCE LEHMAN

*Attesting Officer*     *Commissioner of Patents and Trademarks*